United States Patent [19]

Cox

[11] Patent Number: 5,039,970
[45] Date of Patent: Aug. 13, 1991

[54] SELF-ALIGNING CORE FOR INDUCTION COIL

[75] Inventor: Larry R. Cox, Austin, Tex.

[73] Assignee: Minnesota Mining and Manufacturing Company, St. Paul, Minn.

[21] Appl. No.: 353,455

[22] Filed: May 17, 1989

[51] Int. Cl.[5] .................. H01F 17/06; H01F 27/04; H01F 27/26
[52] U.S. Cl. ............................. 336/107; 324/127; 336/176
[58] Field of Search ............ 336/175, 176, 212, 105, 336/107, 92; 324/127

[56] References Cited

U.S. PATENT DOCUMENTS

| 3,611,136 | 10/1971 | Ito et al. | 324/127 |
| 4,005,380 | 1/1977 | Heilmann et al. | 336/176 X |
| 4,518,913 | 5/1985 | Jackson | 324/127 |
| 4,827,272 | 5/1989 | Davis | 324/127 X |
| 4,885,559 | 12/1989 | Nakano | 336/175 X |

FOREIGN PATENT DOCUMENTS 11729 9/1956 Fed. Rep. of Germany ...... 336/176

OTHER PUBLICATIONS

3M's Test & Measurement Systems' Field Notes includes a discussion of 3M's Prior Art Dyna-Coupler Induction Coil.

Primary Examiner—Thomas J. Kozma
Attorney, Agent, or Firm—Gary L. Griswold; Walter N. Kirn; Jack V. Musgrove

[57] ABSTRACT

An induction coil having two split-ring cores which are self-aligning. Each core is semi-circular, one core being fixed within a first jaw, and the other free to move within a second jaw. The jaws are pivotally attached and biased to form a closed loop in the relaxed state. A spring next to the free core urges the free core against the fixed core as the jaws are brought together. This action insures a proper contact between core ends which is necessary for optimum inductive coupling.

14 Claims, 5 Drawing Sheets

SELF-ALIGNING CORE FOR INDUCTION COIL

Background of the Invention

1. Field of the Invention

The present invention generally relates to electrically conductive coils, and more particularly to an induction coil having a split-ring core with a self-aligning feature.

2. Description of the Prior Art

Induction coils are well known in the art, and are generally used to generate alternating currents or high voltage pulses in conductors, as well as to create high voltage signals from low-voltage current, as is accomplished in a standard transformer. As noted in a related application, Ser. No. 317,820, now U.S. Pat. No. 4,914,399, filed Mar. 1, 1989 (entitled "Induction Coil Driver"), one particular use of an induction coil is to place a test signal on a wire or cable in order to trace the cable. This is often performed on working telephone lines which carry actual conversations. For such an application, it is essential that the trace signal be applied to the telephone line in such a manner as to preclude interruption of the voice signals. This is most conveniently performed via inductive coupling.

One device presently on the market which is used to inductively place trace signals on a wire is a coupler sold by Minnesota Mining & Manufacturing Co. (assignee of the present invention) under the trademark "DYNA-COUPLER." This device is shown in cross-section in FIGS. 1A and 1B. Generally, the DYNA-COUPLER 10 comprises two jaw members 12 and 14 which receive split-ring cores 16 and 18. A coil of wire 20 is wrapped around one of the cores 18 and connected to an external jack 22 which is connected to a coil driver. Cores 16 and 18 are fixed, i.e., they are rigidly held in place by several wedges 24 which are integral with jaws 12 and 14, and they are further secured by epoxy or other adhesives.

While induction coils may consist of an integral conductive ring through which the wire or cable is threaded, it is impossible to so thread a continuous length of wire having no terminal ends (the normal situation encountered when placing a trace signal on a telephone line). Therefore, the core is split into two sections 16 and 18 whereby the split cores may be separated and the wire placed therebetween. This is illustrated in FIG. 1A.

Handle portions 26 and 28 are integral with jaw members 12 and 14, respectively, and a coil spring 30 is attached to handle portions 26 and 28 to bias jaws 12 and 14 together, as shown in FIG. 1B. When the jaws are so biased, an electrical signal sent through coil 20 will be transferred to cores 16 and 18 via electromagnetic induction. A wire placed within jaws 12 and 14 will then likewise receive the trace signal. This sequence, however, is critically dependent upon the contact between split-ring cores 16 and 18. In this regard, it has been found that, due to the fixed nature of the cores within jaws 12 and 14, cores 16 and 18 are often misaligned, or not in contact at all. This is illustrated by the air gap shown between the upper ends of cores 16 and 18 in FIG. 1B.

One device which attempts to overcome this latent defect is depicted in FIG. 2. That device is essentially identical to the device shown in FIGS. 1A and 1B except that the cores are no longer fixed. Rather, they are pivotally mounted on pins 32 which allow both of the cores to rotate. This structure, however, does not completely eliminate misalignment; the necessary result of the pivot action is that both ends of the two cores cannot be independently aligned. There is, in essence, only one degree of freedom (rotation), and when one end is aligned, the other end may be misaligned.

Other techniques exist for optimizing the quality of the contact between split-ring cores. These techniques usually require intensive design parameters (such as dovetailing the core ends) and strict tolerances, which translate to higher manufacturing costs. Such exactitude is necessary in some applications, particularly where the device is used as a receiver rather than a transmitter, and precise sensing of voltage or current is required. The primary purpose of the present invention, however, is to couple an AC trace signal to a wire, and the specific amplitude of the coupled signal is immaterial (the frequency of the signal is of primary consequence). Hence, the exorbitant cost of these improved techniques is commercially unacceptable. It would, therefore, be desirable and advantageous to devise a split-ring induction coil having improved contact performance which may be manufactured without the need for critical design tolerances.

Accordingly, the primary object of the present invention is to provide an induction coil.

Another object of the invention is to provide a split-ring induction coil for use in placing a trace signal on a conductor.

Still another object of the invention is to provide such a split-ring induction coil having improved contact performance.

Yet another object of the invention is to provide simplified assembly of such an induction coil.

SUMMARY OF THE INVENTION

The foregoing objects are achieved in an induction coil having a self-aligning core. The core utilizes bias means and attachment means which allow rotation and some slight translation of the core within its housing. The bias means preferably takes the form of a leaf spring which urges one core against the other. The first core is held in place by greased O-rings which allow the core to slide therethrough. By providing two degrees of freedom of movement of the core, reliable contact between the core ends is achieved without the necessity of strict design tolerances.

BRIEF DESCRIPTION OF THE DRAWINGS

The novel features of the invention are set forth in the appended claims. The invention itself, however, will best be understood by reference to the accompanying drawings, wherein:

DESCRIPTION OF THE PREFERRED EMBODIMENT

Figures 1A, 1B:
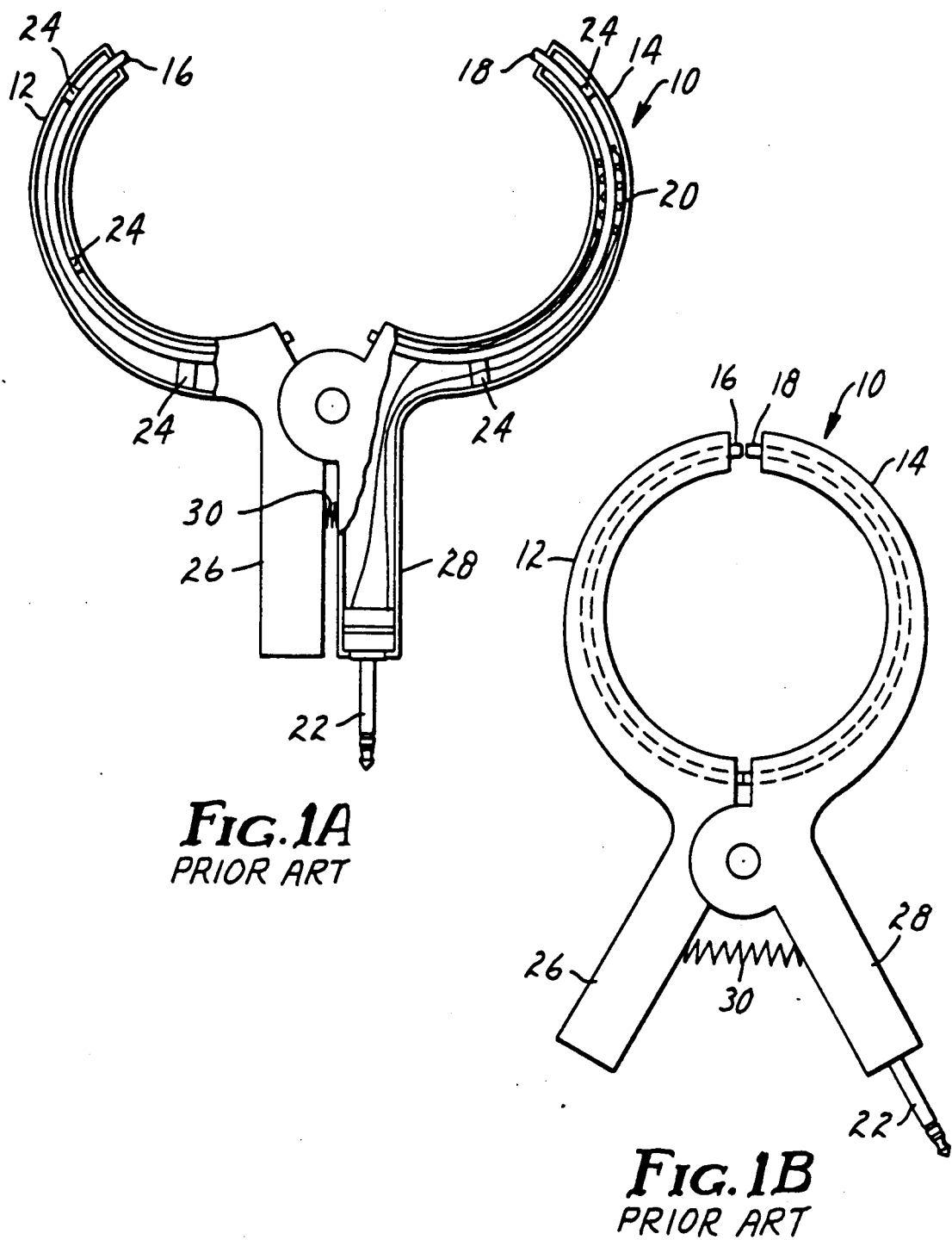
FIG. 1A is a cross-sectional view of the prior art DYNA-COUPLER induction coil depicting the jaws open.
FIG. 1B is identical to FIG. 1A except the jaws have been closed.
Figure 3:
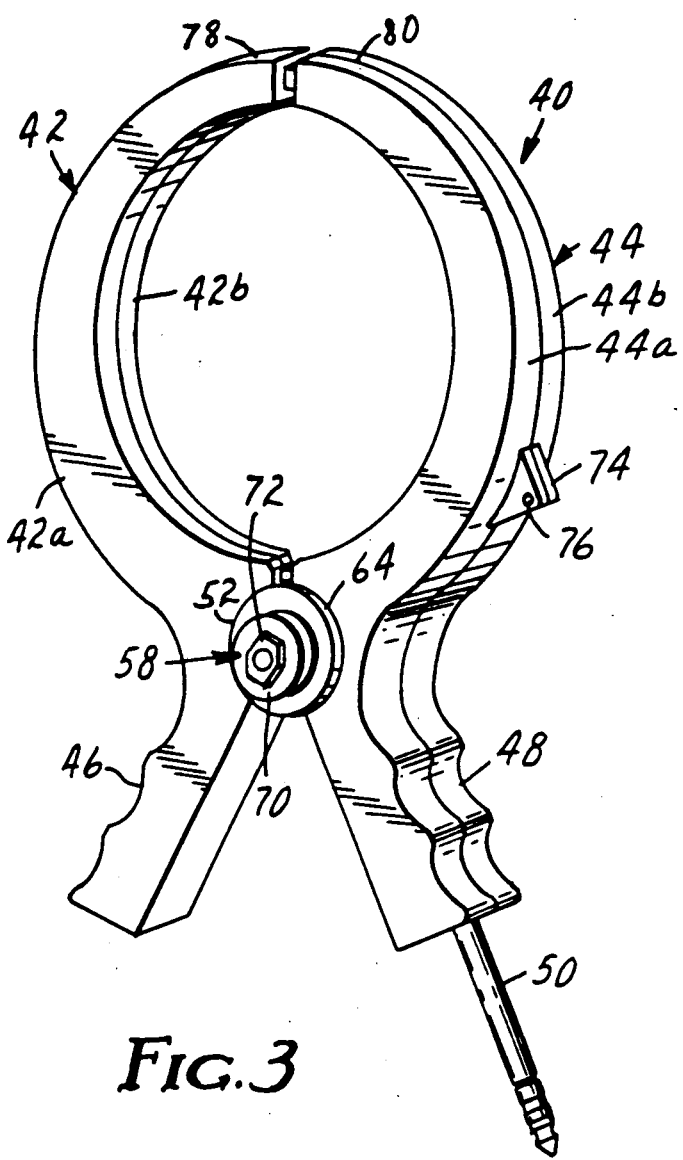
FIG. 3 is a perspective view of the induction coil of the present invention.
Figure 4:
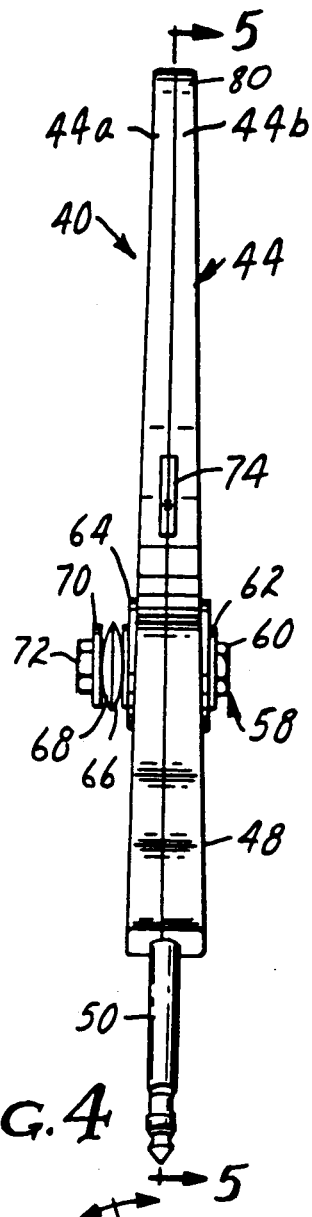
FIG. 4 is a side elevational view of the present invention.
Figure 2:
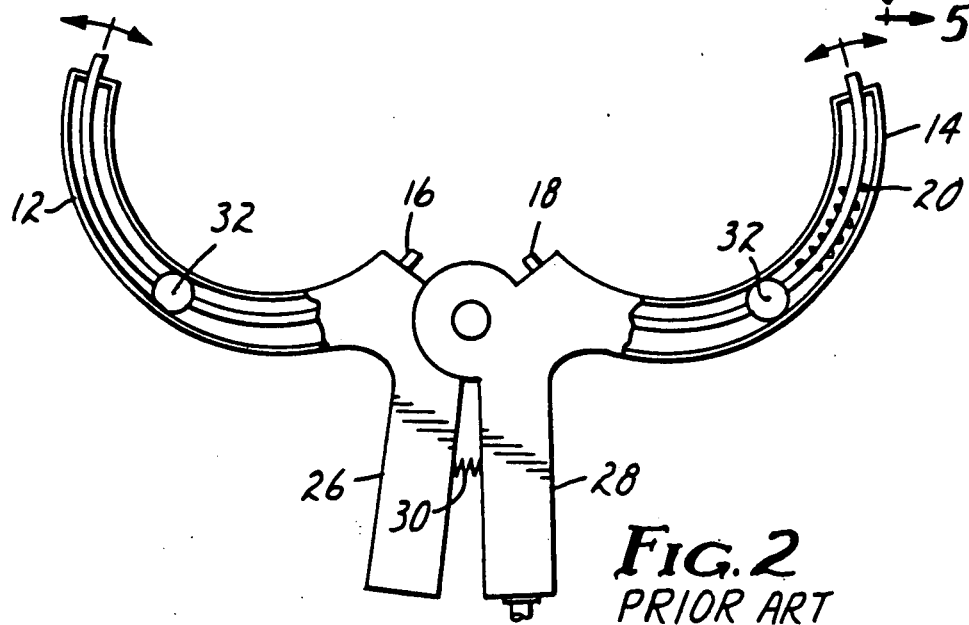
FIG. 2 is a cross-sectional view of another prior art device having pivoting split cores.

With reference now to the figures, and in particular with reference to FIGS. 3 and 4, there is depicted an induction coil 40 of the present invention. Induction coil 40 is generally comprised of left and right jaws 42 and 44, each having integral handle portions 46 and 48. Jaws 42 and 44 are preferably interchangeable, i.e., a rear perspective of the device would appear identical to the front perspective shown in FIG. 3, except for the location of a jack 50. Jaws 42 and 44 may be constructed of any durable material; however, in order to facilitate electromagnetic induction, the material should be nonconductive and nonmagnetic. The favored material is impact resistant ABS (acrylonitrile butadiene styrene), which may conveniently be injection molded. Of course, handle portions 46 and 48 need not be formed integrally with jaws 42 and 44, but this is preferred due to the injection molded construction. Handle portions 46 and 48 may be provided with ridges to assist gripping.

Jaws 42 and 44 each have a rounded hub 52 and a complimentary arcuate surface (axially offset concavity) 54 near handle portions 46 and 48. Hub 52 has a hole 56 therein (visible in FIG. 6) which receives fastening means 58. In the preferred embodiment, fastening means 58 consists of a bolt 60, steel washers 62 and 64, Belville washers 66 and 68, washer 70, and nut 72. The use of Belville washers 66 and 68 in fastening means 58 provides a secure attachment between jaws 42 and 44 without unduly binding them; this allows free pivotal movement of jaws 42 and 44 about bolt 60, and facilitates a complete contact of the split-ring cores as explained below.

Jaws 42 and 44 each have an integral tab 74 with an aperture 76 therein. Tab 74 is provided for use of the device with an extension pole (not shown). If induction coil 40 is to be used on, say, an aerial cable, it may be attached to the extension pole, and a string tied through hole 76. In this manner, the string may be pulled to remotely open jaws 42 and 44. Jaws 42 and 44 are also preferably tapered at their distal ends 78 and 80.

Figure 5:
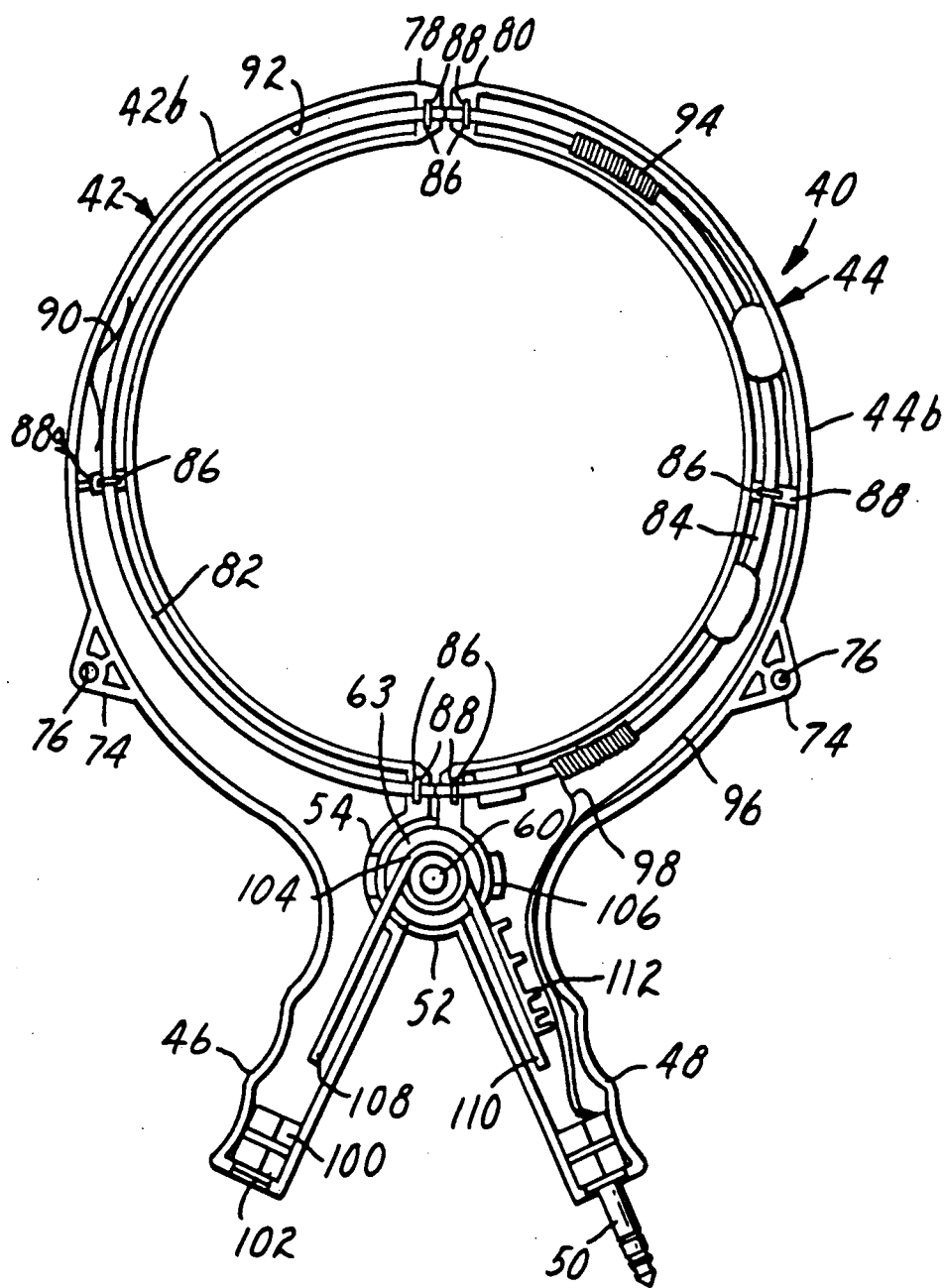
FIG. 5 is a cross-sectional view of the present invention taken along lines 5—5 of FIG. 4.

Referring now to FIG. 5, a cross-section of induction coil 40 (along lines 5—5 of FIG. 4) is shown, in which split-ring cores 82 and 84 are visible. Split-ring cores 82 and 84 are contained in jaws 42 and 44, respectively, and may be formed of any conductive material. In the preferred embodiment, cores 82 and 84 are constructed of a laminated nickel alloy sold under the brand name SUPERMALLOY by Magnetics, Inc., of Butler, Pennsylvania. Although cores 82 and 84 are optimally perfect semi-circles, they need not be, due to the self-aligning feature described below. Therefore, split-ring cores 82 and 84 may actually be fabricated from a single full circle which has been cut (approximately) in half. Accordingly, use of the term "semi-circular" in the claims does not imply a full 180° arc.

Split-ring core 84 is securely fixed to jaw 44 in the manner described below in conjunction with FIG. 6. Split-ring core 82, however, is allowed some freedom of movement. Split-ring core 82 is essentially held in place by a plurality of o-rings 86 which lie in several slotted o-ring seats 88. O-rings 86 are lubricated, allowing core 82 to slide therethrough. In other words, o-rings 86 and seats 88 act as guides for core 82. Furthermore, one particular o-ring seat 88a has a longer slot therein which allows the O-ring (and hence core 82) to move transversely within jaw 42, in addition to the rotational motion occurring as core 82 slides through o-rings 86. Thus, when jaws 42 and 44 are brought together, these two degrees of freedom allow core 82 to move as its ends contact the ends of core 84. Core 82 is thereby optimally aligned with core 84.

It may be easily understood that forcible contact between cores 82 and 84 tends to push core 82 away from core 84. Because of this, bias means are employed to urge core 82 against core 84. In the preferred embodiment, the bias means takes the form of a leaf spring 90. Leaf spring 90 is simply a curved piece of flexible steel which is inserted between core 82 and an inner wall 92 of jaw 42. In order to minimize friction, leaf spring 90 is also greased. In the illustrative embodiment, leaf spring 90 is prevented from moving within jaw 42 by o-ring seat 88a at one end, and by the tapering of jaw 42 at the other end. Of course, many other bias means may be utilized in place of leaf spring 90. For example, a coil spring (not shown) may be substituted, but leaf spring 90 is preferred as it creates less friction. Alternatively, a spring which provides a pulling action, rather than a pushing action, may be placed on the opposite side of core 82 with respect to the position of leaf spring 90 as shown in FIG. 5.

FIG. 5 illustrates several other features of the present invention. Core 84 has one or more windings 94 thereabout which are connected, via wires 96 and 98, to external jack 50. If two or more windings are present, they are preferably connected in series. Wires 96 and 98 are connected to jack 50 by any convenient method, such as soldering. As those skilled in the art will appreciate, a direct electrical connection may be made to cores 82 and 84, eliminating the need for inductive transfer via windings 94. This configuration, while equivalent to windings 94, is nevertheless deemed undesirable.

A nut or threaded insert 100 may optionally be provided inside the end of handle 46. As explained above, induction coil 40 may be used with an extension pole; the distal end of the extension pole would mate with threaded insert 100. An opening 102 in handle 46 for access to threaded insert 100 is already present since, as noted above, jaws 42 and 44 are interchangeable, and the molds for jaws 42 and 44 are provided with such a hole, primarily for jack 50. Finally, a torsion spring 104 is contained within hub 52, held in place by a barrier or boss 106. A first tine 108 of torsion spring 104 lies within handle 46, While the second tine 110 lies within handle 48. Tines 108 and 110 are held in place by a fence 112 integrally molded With handles 46 and 48. Torsion spring 104 thus forcibly urges jaws 42 and 44 together.

Figure 6:
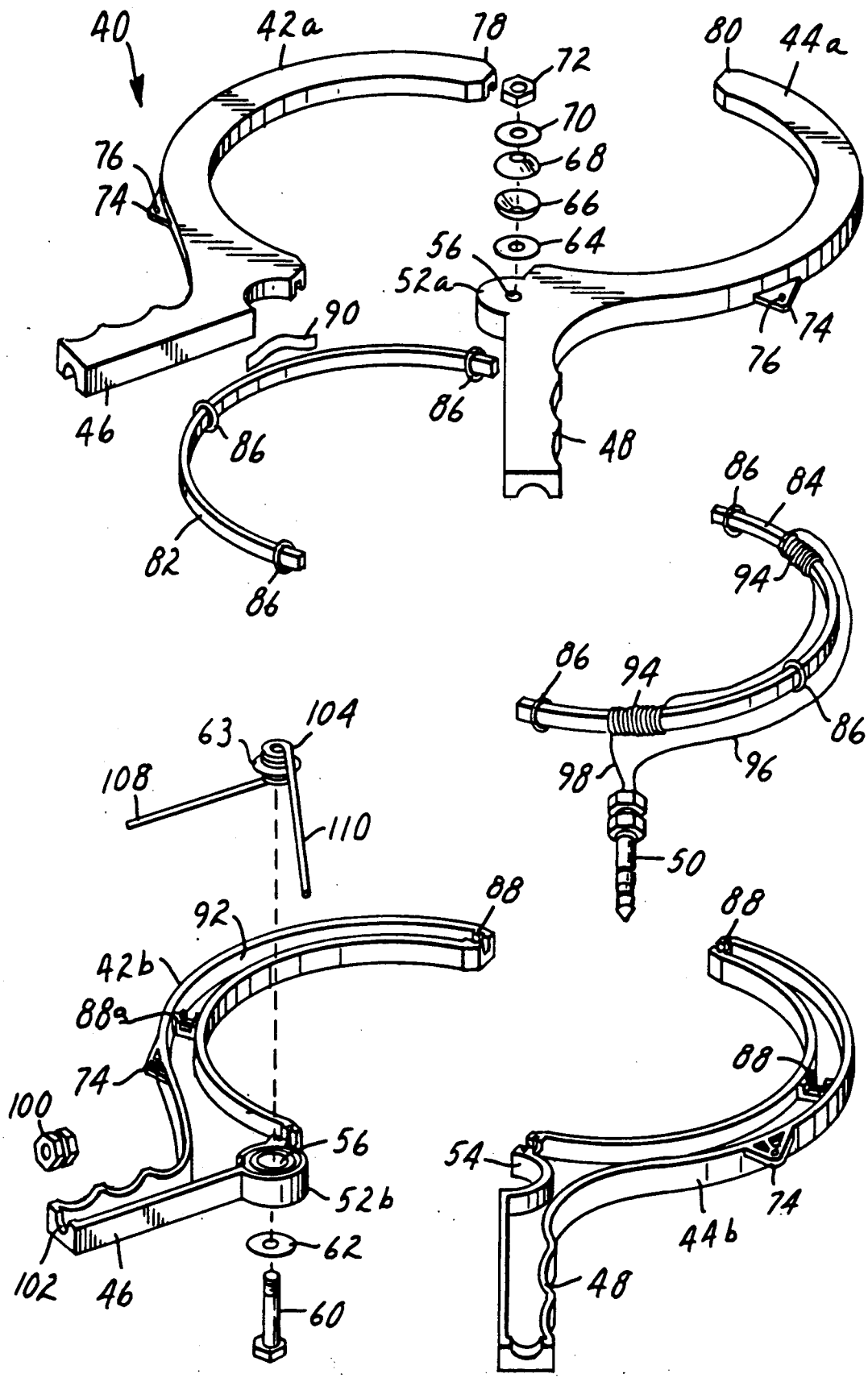
FIG. 6 is an exploded perspective view of the present invention.

The assembly of induction coil 40 may best be understood with reference to FIG. 6 which is an exploded perspective view. FIG. 6 more clearly illustrates the simplified fabrication or jaws 42 and 44. Jaws 42 and 44 are formed of upper and lower sections, i.e., jaw 42 includes sections 42a and 42b, while jaw 44 includes sections 44a and 44b. Only two molds are necessary for these four sections because section 42a is identical to section 44b, and section 42b is identical to section 44a.

The assembly of induction coil 40 begins with the placement of o-rings 86 and windings 94 on split-ring core 84. After these are in place, core 84 is positioned in lower section 44b of jaw 44 (with o-rings 86 sitting in seats 88) and secured by any convenient means. In the preferred embodiment, a hot melt glue is first used to temporarily hold core 84 in place, and then an RTV (room temperature vulcanizing) silicone rubber is applied around core 84 and allowed to solidify. Wires 96 and 98 may now be connected to jack 50, and jack 50 positioned at the end of handle 48. Section 44a is then placed over section 44b containing core 84, and the two sections 44a and 44b affixed together, preferably by sonic welding. This completes assembly of jaw 44.

The assembly of jaw 42 is somewhat simpler since it does not involve any windings or adhesives. Rather, core 82 is simply inserted through o-rings 86 and placed within section 42b. Leaf spring 90 is inserted between core 82 and inner wall 92, and all of the o-rings and the leaf spring are greased. Section 42a is placed over core 82 and section 42b, and the sections affixed by sonic welding. This completes assembly of jaw 42.

The final steps in the assembly of induction coil 40 involve torsion spring 104 and fastening means 58. Although the jaws 42 and 44 have been sealed (i.e., sections 42a and 42b have been welded together, as with sections 44a and 44b), there is still access to the inside of handles 46 and 48. This is due to the fact that hub 52 is actually comprised of upper and lower hubs 52a and 52b, upper hub 52a being integral with jaw 44, and lower hub 52b being integral with jaw 42. Thus, tine 108 may be inserted into handle 46, and tine 110 may be inserted into handle 48 (both tines being confined by fences 112). Before inserting torsion spring 104 into the jaws, however, another washer 63, not visible in FIG. 4, is threaded onto torsion spring 104 to an intermediate position. Washer 63 contacts the inner surfaces of hubs 52a and 52b, and should appropriately be constructed of a low-friction material, such as nylon. As jaws 42 and 44 are brought together, upper hub 52a mates with lower hub 52b, and the torsion spring is centered with the aid of boss 106. Bolt 60 is then guided through hole 56, and secured with the various washers and nuts described above. The finished induction coil 40 is then ready for use.

Figure 7:
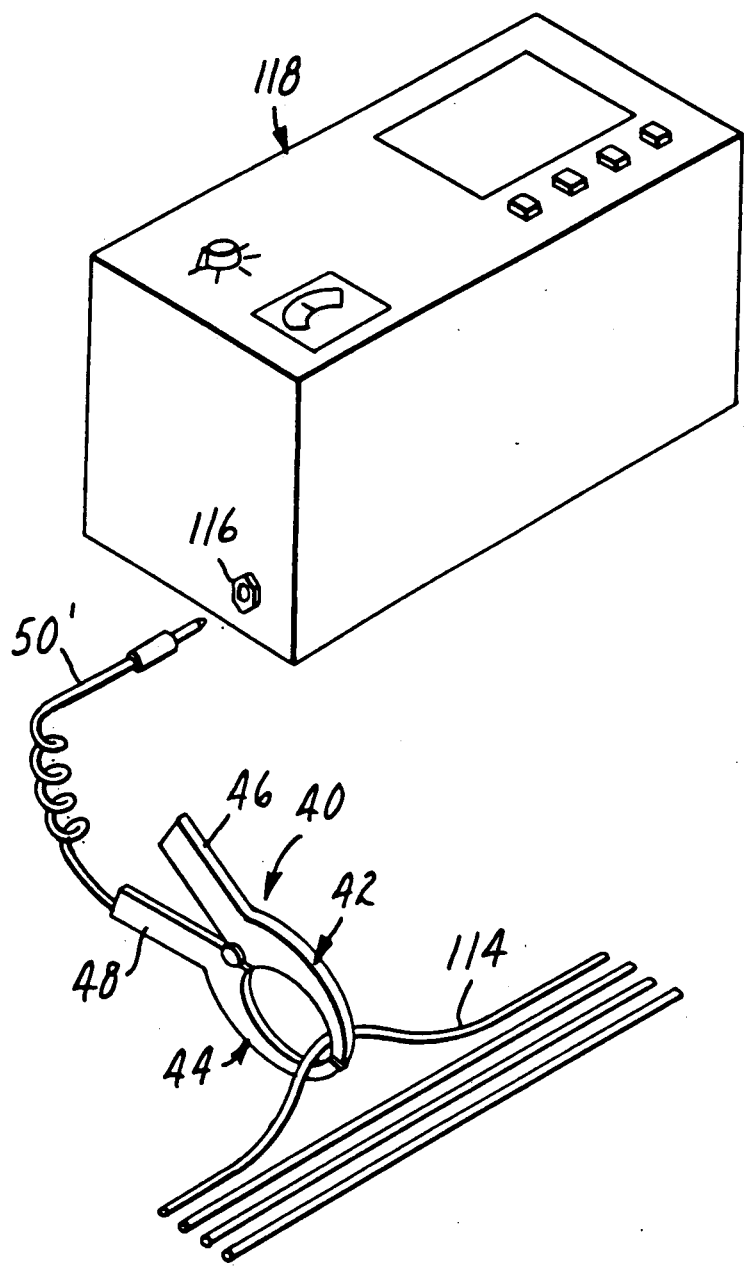
FIG. 7 is a perspective view showing use of the induction coil of the present invention for placing a signal on a wire.

Operation of induction coil 40 is fairly straightforward. It may be used as a receiver, but it is anticipated that its primary use will be as a transmitter in applying a trace signal to a cable or wire 114, as shown in FIG. 7 In that figure, external jack 50 has been replaced by an extension cord 50' having a jack at its terminal end. Cord 50' is connected to the port 116 of a receiver/transmitter 118. The details of receiver/transmitter 118 go beyond the scope of the present invention, but for further information the reader is directed to U.S. patent application Ser. No. 317,820 (filed Mar. 1, 1989), entitled "Induction Coil Driver."

Handles 46 and 48 are squeezed together, opening jaws 42 and 44. The selected wire 114 is placed between jaws 42 and 44 (several wires may be so placed), and handles 46 and 48 released. Torsion spring 104 causes jaws 42 and 44 to come together, further causing the ends of core 84 to abut the ends of core 82. Core 82 then moves as described above to achieve optimal alignment with core 84, eliminating any air gap between the two cores A trace signal is passed from receiver/transmitter (induction coil driver) 118 to induction coil 40 via extension cord 50'. By means of electromagnetic induction, the signal is picked up on wire 114, which then re-radiates the trace signal along its entire length.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. For example, both cores 82 and 84 may be slidably attached to jaws 42 and 44 with the addition of another leaf spring abutting core 84. It is therefore contemplated that the appended claims will cover such modifications that fall within the true scope of the invention.

I claim:

1. A device for inductively coupling a conductor to a receiver/transmitter, comprising:
   a first jaw member;
   a second jaw member pivotally attached to said first jaw member;
   a first arcuate core member located within said first jaw member, said first arcuate core member having first and second ends, each of said ends extending outside of said first jaw member, said first arcuate core member being slidable along a path defined by the curve of said first arcuate core member;
   a second arcuate core member located within said second jaw member, said second arcuate core member having first and second ends, each of said ends extending outside of said second jaw member;
   first bias means for urging said ends of said first core member away from said first jaw member whereby, when said jaw members are brought together, said ends of said first core member forcibly abut said ends of said second core member; and
   means for electrically coupling one of said first or second core members to the receiver/transmitter.

2. The device of claim 1 wherein said first bias means comprises spring means disposed between said core member and an inner wall of said first jaw member.

3. The device of claim 2 further comprising second bias means for urging said jaw members together.

4. The device of claim 3 further comprising:
   a first handle member attached to said first jaw member; and
   a second handle member attached to said second jaw member.

5. The device of claim 4 wherein said second core member is securely fixed within said second jaw member.

6. The device of claim 5 wherein said means for electrically coupling one of said first or second core members to the receiver/transmitter comprises:
   jack means; and
   a wire wrapped around said second core member forming at least one winding, said wire being electrically connected to said jack means.

7. The device of claim 6 further comprising fastening means for pivotally attaching said first and second jaw members, said fastening means including means for reducing friction between said first and second jaw members.

8. The device of claim 7 wherein:
   said first jaw member has a plurality of o-ring seats therein; and
   said first core member is inserted through a plurality of o-rings, said o-rings being situated in said o-ring seats, and said o-rings being lubricated to facilitate sliding movement of said first core member through said o-rings.

9. An induction coil comprising:

a first hollow, substantially semi-circular jaw having first and second ends, and having a plurality of o-ring seats therein;

a second hollow, substantially semi-circular jaw having first and second ends;

fastening means for pivotally attaching said first end of said first jaw to said first end of said second jaw, said fastening means including means for reducing friction between said first and second jaws;

a first semi-circular, electrically conductive core located within said first jaw, said first core having first and second ends, said first end of said first core extending beyond said first end of said first jaw, and said second end of said first core extending beyond said second end of said first jaw;

a plurality of o-rings situated in said o-ring seats of said first jaw, said first core being inserted through said o-rings;

a second semi-circular, electrically conductive core located within said second jaw, said second core having first and second ends, said first end of said second core extending beyond said first end of said second jaw, and said second end of said second core extending beyond said second end of said second jaw;

first bias means for urging said first core towards said second core whereby, when said second ends of said jaws are moved proximate one another, said ends of said first core forcibly abut said ends of said second core;

second bias means for urging said second ends of said jaws toward each other;

first handle means attached to said first jaw proximate said first end thereof;

second handle means attached to said second jaw proximate said first end thereof; and means for electrically coupling said second core to an external receiver/transmitter.

10. The induction coil of claim 9 wherein one of said o-ring seats is located proximate a central portion of said first core, and said centrally located o-ring seat has a slot therein which is longer than the diameter of said o-rings, thereby allowing said first core to move transversely within said first jaw.

11. The induction coil of claim 10 wherein:
said second core is securely fixed within said second jaw; and
said first bias means comprises a leaf spring positioned between said first core and an inner wall of said first jaw, proximate said centrally located o-ring seat.

12. The induction coil of claim 11 wherein said means for electrically coupling said second core to the external receiver/transmitter comprises:
a jack attached to said second handle; and
a wire wrapped around said second core forming at least one winding, said wire being electrically connected to said jack.

13. The induction coil of claim 12 further comprising:
means for receiving an extension pole, said receiving means being attached to said first handle; and
means for remotely opening said jaws.

14. A split-ring, self-aligning induction coil for applying a trace signal to a wire, comprising:

a first hollow, semi-circular jaw having a first hub and a first integral handle proximate said hub, said first jaw being formed of a nonconductive, nonmagnetic material, and said first jaw having a plurality of o-ring seats therein;

a second hollow, semi-circular jaw whose size, shape and material are essentially identical to said first jaw, having a second hub and a second integral handle proximate said second hub;

fastening means for pivotally attaching said first jaw to said second jaw, said fastening means including means for reducing friction between said first and second hubs;

a first semi-circular core located within said first jaw, said first core being constructed of a laminated nickel alloy, and having first and second ends, each of said ends extending outside of said first jaw, said first core being inserted through a plurality of o-rings, said o-rings being situated in said o-ring seats, and said o-rings being lubricated to facilitate sliding movement of said first core through said o-rings, one of said o-ring seats further being located proximate a central portion of said first core, said centrally located o-ring seat having a slot therein which is longer than the diameter of said o-rings, thereby allowing said first core to move transversely within said first jaw;

a second semi-circular core located within said second jaw, said second core being constructed of a laminated nickel alloy, and having first and second ends, each of said ends extending outside of said second jaw, said second core being securely fixed within said second jaw;

a leaf spring positioned between said first core and an inner wall of said first jaw, proximate said centrally located o-ring seat, said leaf spring urging said first core towards said second core whereby, when said jaws are brought together, said ends of said first core forcibly abut said ends of said second core, forming a substantially circular closed loop;

a torsion spring for urging said jaws together, said torsion spring having first and second tines, said first tine being inserted in said first handle, and said second tine being inserted in said second handle;

a threaded insert attached to said first handle for receiving an extension pole;

a tab attached to said second jaw for receiving string means to remotely open said jaws;

a jack attached to said second handle; and a wire wrapped around said second core forming at least one winding, said wire being electrically connected to said jack.

* * * * *